United States Patent [19]
Watanuki

[11] Patent Number: 5,168,302
[45] Date of Patent: Dec. 1, 1992

[54] APPARATUS FOR PERMEATING IRRADIATED LIGHT

[75] Inventor: Minoru Watanuki, Tokyo, Japan

[73] Assignee: ORC Manufacturing Co., Ltd., Tokyo, Japan

[21] Appl. No.: 685,648

[22] Filed: Apr. 16, 1991

[30] Foreign Application Priority Data

Apr. 18, 1990 [JP] Japan .................. 2-102650

[51] Int. Cl.$^5$ .................................. G03B 27/54
[52] U.S. Cl. ........................... 355/30; 355/67; 359/253; 359/272; 313/12; 313/22; 362/16; 362/96; 362/373
[58] Field of Search ............. 355/67, 71, 77, 228, 355/30; 359/253, 238, 272, 275, 288; 250/204, 504 R, ; 313/12, 22, 35; 362/16, 96, 101, 294, 373

[56] References Cited

U.S. PATENT DOCUMENTS

| | | | |
|---|---|---|---|
| 3,914,010 | 10/1975 | Zeller | 313/12 X |
| 4,000,407 | 12/1976 | Keller et al. | 362/218 |
| 4,431,257 | 2/1984 | Born | 359/358 |
| 5,032,021 | 7/1991 | Kanatani et al. | 359/40 X |

Primary Examiner—Michael L. Gellner
Assistant Examiner—D. Rutledge
Attorney, Agent, or Firm—Cushman, Darby & Cushman

[57] ABSTRACT

A light permeating apparatus preferably employable for an exposing equipment, a drying equipment, a printing equipment for forming a pattern on a printed circuit board is disclosed. The apparatus includes an opposing pair of light permeable plates, a casing fixedly secured to the light permeable plates, a filter disposed in the inclined state in the flat space defined between the light permeable plates to divide the interior of the flat space into two parts, a liquid supply tube attached to the fore end of the casing and liquid discharge tubes attached to the rear end of the casing. The opposite sides and the rear side of the casing are designed in the flow passage-shaped configuration, and a plurality of holes are formed on the inner wall of each of the flow passages on the opposite sides and the rear side of the casing. A material employable for the light permeable plates and a material employable for the filter are properly selected so as to selectively absorb undesirable wavelength components in an irradiated light. A bubble disintegrating unit is disposed at the intermediate position in the liquid supply tube or on the inlet side of the casing.

2 Claims, 8 Drawing Sheets

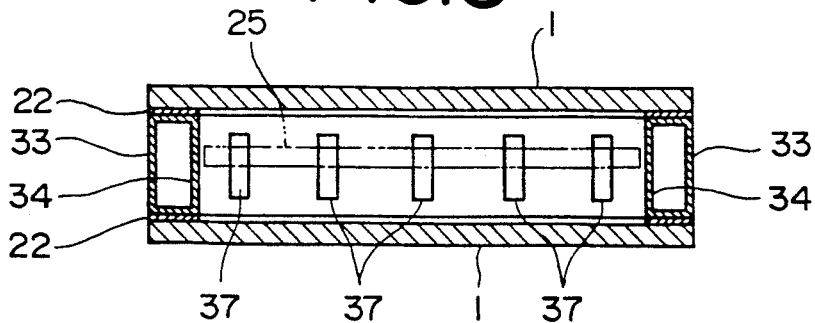
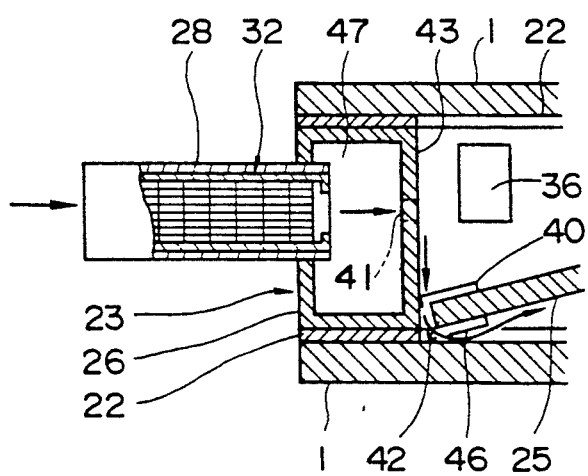
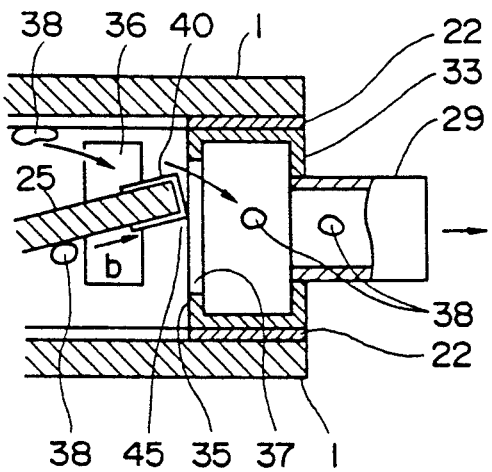
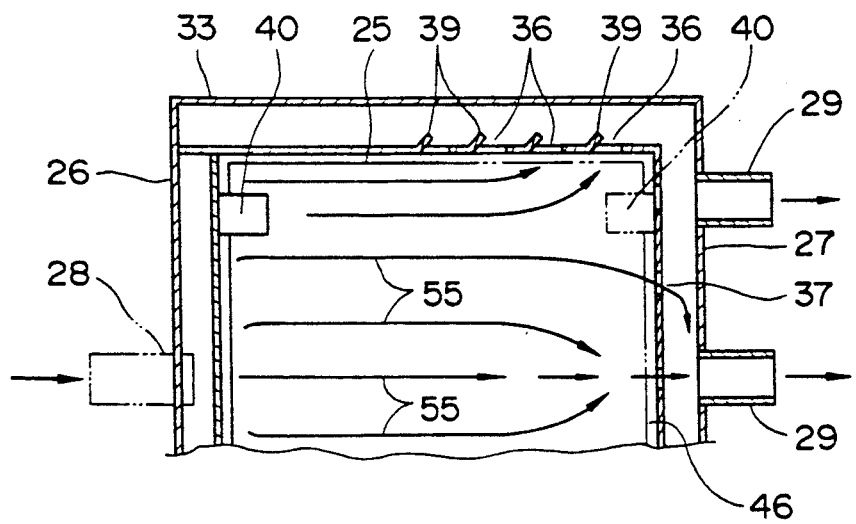

FIG.11
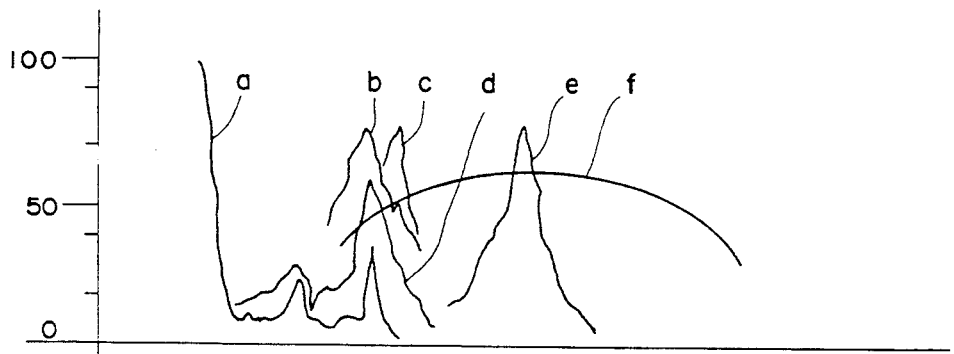
LIGHT ABSORPTION CHARACTERISTIC DIAGRAMS FOR VARIOUS KINDS OF PHOTOSENSITIVE MATERIALS
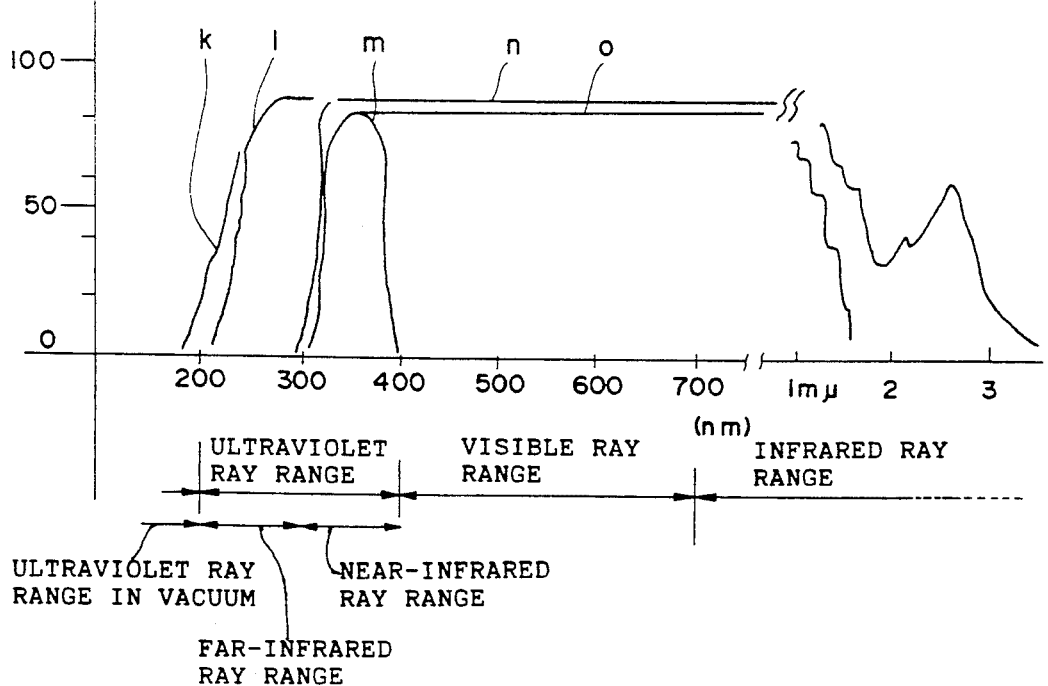
LIGHT ABSORPTION CHARACTERISTIC DIAGRAMS FOR VARIOUS KINDS OF FILTERS

APPARATUS FOR PERMEATING IRRADIATED LIGHT

BACKGROUND OF THE INVENTION

1. Field of the Invention

The present invention relates generally to an apparatus for permeating an irradiated light wherein the apparatus can widely be employed for an exposing equipment, a drying equipment, a printing equipment or the like photographic equipment which are employable for forming a pattern on a printed circuit board, for photographically making a printing plate for printing operations, for drying various kinds of organic materials such as an optically hardenable type paint, a resin, an ink, a varnish or the like material or for forming a hardened film. More particularly, the present invention relates to an apparatus for permeating an irradiated light wherein the apparatus is arranged at the intermediate position in an optical passage between a light source and an object to be irradiated with a light so as to remove heat rays and undesirable wavelength components in the irradiated light and moreover effectively prevent an adverse effect due to bubbles in a cooling liquid for cooling the apparatus.

2. Description of the Related Art

With respect to the exposing equipment for forming a pattern on a printed circuit board, the ultraviolet ray irradiating equipment for hardening a resin or the like apparatus, various kinds of proposals have been heretofore made for cooling means in the form of liquid type direct cooling means or forcible air-cooling type cooling means so as to elongate the running life of a discharge lamp. However, a sufficient quantity of research works have been not conducted with respect to a light permeating apparatus for suppressing thermal expansion of an object to be irradiated with a light and removing undesirable wavelength components in the irradiated light for the purpose of exhibiting and maintaining a normal function for a photosensitive material (so-called indirect cooling means).

To facilitate understanding of the present invention, a typical conventional light permeating apparatus will be described below with reference to FIG. 17 and FIG. 18. The conventional apparatus includes as essential components an opposing pair of light permeable plates 1 made of quartz or hard glass, a box-shaped casing 3 for defining a flat space 2 inside of the light permeable plates 1, a liquid supply tube 6 attached to the fore end 4 of the casing 3 and a liquid discharge tube 7 attached to the rear end 5 of the casing 3. When an irradiated light 8 permeates through the apparatus, the light permeable plates 1 absorb heat rays in the irradiated light 8. As the light permeable plates 1 are heated up to an elevated temperature by thermal absorption of the heat rays, they are cooled by a cooling liquid flowing through the space 2 (the flowing of the cooling liquid in the space 2 being represented by arrow marks a in the drawings).

However, it has been found that the conventional apparatus has the following problems.

(i), Since the apparatus is placed in the horizontally laid state at the intermediate location in an optical passage between a light source and an object to be irradiated with a light (representing the state as shown in FIG. 17), bubbles 10 in the cooling liquid are increasingly grown in size and floated up as a temperature of the cooling liquid is elevated during practical use of the apparatus. As is best seen in FIG. 17, the enlarged bubbles 10 adhere to the lower surface of the upper light permeable plate 1 and vibrantly move as the cooling liquid flows in the a marked-direction, whereby an optical passage of the irradiated light 8 is turbulently affected, causing formation of a clear image on a photosensitive material to be obstructed substantially.

(ii) Since the enlarged bubbles 10 are interposed between the upper light permeable plate 1 and the cooling liquid, effective cooling of the light permeable plates 1 is adversely affected and thereby proper function of the apparatus is degraded. In an extreme case, the apparatus is undesirably damaged. For this reason, practical use of the apparatus is limited only to a case where the apparatus is arranged with a vertical attitude, resulting in the applicable range of the apparatus being narrowed.

(iii) Since the apparatus has a low heat ray absorption rate (remaining within the range of about 10%), it is difficult to suppress thermal expansion of an object to be irradiated with a light, e.g., a printed circuit board. In addition, since the apparatus hardly absorbs harmful wavelength components other than the heat rays, there is a need of employing a discharge lamp which sufficiently matches with optical reactive characteristics of the photosensitive material.

SUMMARY OF THE INVENTION

The present invention has been made in consideration of the aforementioned problems.

An object of the present invention is to provide an apparatus for permeating an irradiated light wherein the apparatus can stably be used by removing bubbles in a cooling liquid, irrespective of an attitude to be assumed by the apparatus.

Other object of the present invention is to provide an apparatus for permeating an irradiated light wherein the apparatus assures that a clear image can be formed on a photosensitive material in an exposing equipment or the like photographic equipment.

Another object of the present invention is to provide an apparatus for permeating an irradiated light wherein the apparatus selectively absorbs heat rays and undesirable wavelength components in the irradiated light which are unacceptable for a photosensitive material.

To accomplish the above objects, the present invention provides an apparatus for permeating an irradiated light wherein the apparatus is arranged at the intermediate position in an optical passage between a light source and an object to be irradiated with a light so that a part of the irradiated light is absorbed by the apparatus and the residual part of the same is irradiated toward a photosensitive material on the object, wherein the apparatus includes as essential components an opposing pair of light permeable plates arranged in the spaced relationship, a casing fixedly secured to the light permeable plates along the peripheral edge thereof to define a flat space between the light permeable plates, a filter disposed in the inclined state in the forward/rearward direction in the flat space to divide the interior of the flat space into two parts, a liquid supply tube attached to the fore end of the casing so as to allow a cooling liquid to flow through the flat space and liquid discharge tubes attached to the rear end of the casing so as to allow the cooling liquid to be discharged from the flat space to the outside; at least the opposite sides and the rear side of the casing are constructed in the flow passage-shaped configuration, respectively; a plurality of holes are formed on the inner wall of each of the flow passages on the opposite sides and the rear side of the casing; and a material employable for the light permeable plates and a material employable for the filter are properly selected so as to selectively absorb undesirable wavelength components in the irradiated light.

To carry out the present invention, it is desirable that a bubble disintegrating unit is disposed at the intermediate position of the liquid supply tube or on the inlet side of the casing.

Since the apparatus of the present invention is constructed in the above-described manner, the following advantages are obtainable with the apparatus of the present invention.

(i) In a case where the apparatus is arranged in the horizontally laid state (as shown in FIG. 17), the cooling liquid which has flowed in the apparatus enters the upper flow passage of which cross-sectional area is gradually reduced in the direction of flowing of the cooling liquid. While the cooling liquid flows through the upper flow passage, a flowing speed of the cooling liquid is increased and thereby bubbles adhering to the lower surface of the upper light permeable plate are discharged to the outside. On the other hand, while the cooling liquid flows through the lower flow passage of which cross-sectional area is gradually enlarged in the direction of flowing of the cooling liquid, bubbles floated up in the cooling liquid are displaced along the lower surface of the filter in the slantwise upward direction to reach the rear end of the filter from which the bubbles are discharged to the outside. With this construction, an optical passage of the irradiated light is not turbulently disturbed at all, whereby a clear image can be formed on a photosensitive material. In addition, excessive heating of the light permeable plates is reliably prevented and thereby safety of the apparatus is guaranteed.

(ii) Sine a material for the light permeable plates and a material for the filter are properly selected and they are then assembled together, it becomes possible to remove heat rays and undesirable wavelength components in the irradiated light. This makes it possible to prevent thermal expansion of the surface of an object to be irradiated with a light as well as an adverse effect on a photosensitive material to be photographically processed.

(iii) By virtue of the advantage a mentioned in the preceding paragraph (ii), there is no need of preparing a light source which properly matches with an optical reactive property of the photosensitive material. Consequently, various kinds of light sources can be utilized for multi purposes.

Other objects, features and advantages of the present invention will become apparent from reading of the following description which has been made in conjunction with the accompanying drawings.

BRIEF DESCRIPTION OF THE DRAWINGS

The present invention is illustrated in the following drawings in which:

FIG. 1 to FIG. 6 illustrate an apparatus for permeating an irradiated light in accordance with a first embodiment of the present invention, respectively, wherein FIG. 1 is a sectional side view of the apparatus, FIG. 2 is a plan view of the apparatus as seen in the II arrow-marked direction in FIG. 1, FIG. 3 is a sectional view of the apparatus as seen in III arrow-marked direction in FIG. 1, FIG. 4 is a fragmentary sectional view of the apparatus, particularly illustrating the structure of a VI arrow-marked section in FIG. 1 on an enlarged scale, FIG. 5 is a fragmentary sectional view of the apparatus, particularly illustrating the structure of V arrow-marked section in FIG. 1 on an enlarged scale, and FIG. 6 is a fragmentary plan view of the apparatus as seen in VI arrow-marked direction in FIG. 1;

FIG. 11 shows light absorption characteristic diagrams for various kinds of photosensitive materials and light absorption characteristics diagrams for various kinds of materials employable for a filter;

DESCRIPTION OF THE PREFERRED EMBODIMENTS

Figure 1:
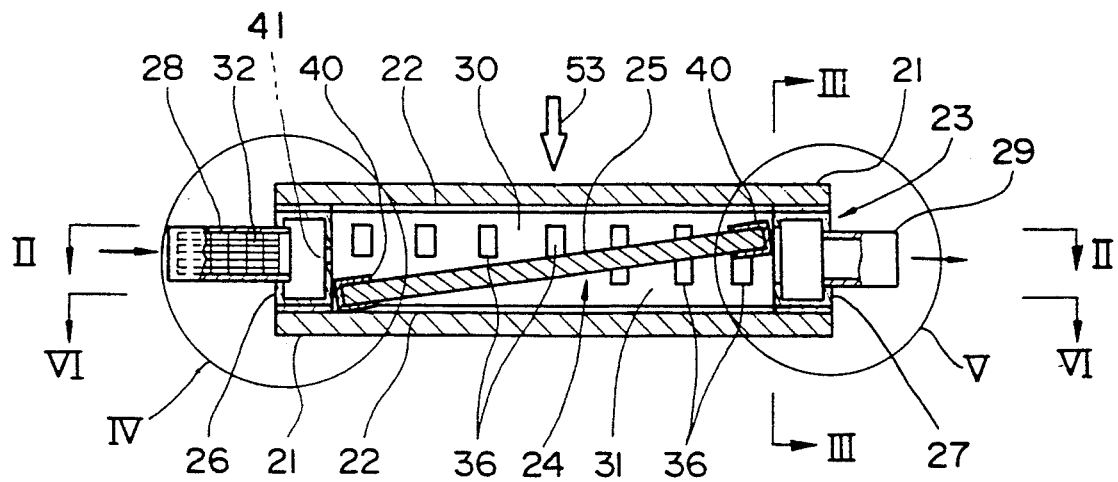

Now, the present invention will be described in detail hereinafter with reference to the accompanying drawings which illustrate preferred embodiments of the present invention.

FIG. 1 to FIG. 6 illustrate an apparatus for permeating an irradiated light (hereinafter referred to simply as an apparatus) in accordance with a first embodiment of the present invention, respectively. The apparatus includes as essential components an opposing pair of flat plate-shaped light permeable plates 21 each having a substantially square contour, a box-shaped casing 23 interposed between the both light permeable plates 21 the upper and lower surfaces of the casing 23 being fixedly secured to the inner surfaces of the light permeable plates 21 along the peripheral edge of the same, a flat plate-shaped filter 25 disposed in a flat space 24 defined by the casing 23 and the light permeating plates 21 in the inclined state in the forward/rearward directions, a liquid supply pipe 28 attached to the fore end part 26 of the casing 23 and three liquid discharge pipes 29 attached to the rear end part 27 of the casing 23. In addition, an upper wedge-shaped flow passage (hereinafter referred to simply as an upper flow passage) 30 is formed above the filter 25 such that its cross-sectional area is gradually reduced toward the rear end of the filter 25, while a lower wedge-shaped passage (hereinafter referred to simply as a lower flow passage) 31 is formed below the filter 25 such that its cross-sectional area is gradually enlarged toward the rear end of the filter 25.

The liquid supply tube 28 is communicated with the fore end part 26 of the casing 26 at the intermediate part of a distributing passage which in turn is communicated with the upper flow passage 31 via a plurality of apertures 41. It should be noted that a bubble disintegrating unit 32 to be described later is received in the liquid supply tube 28.

Figure 2:
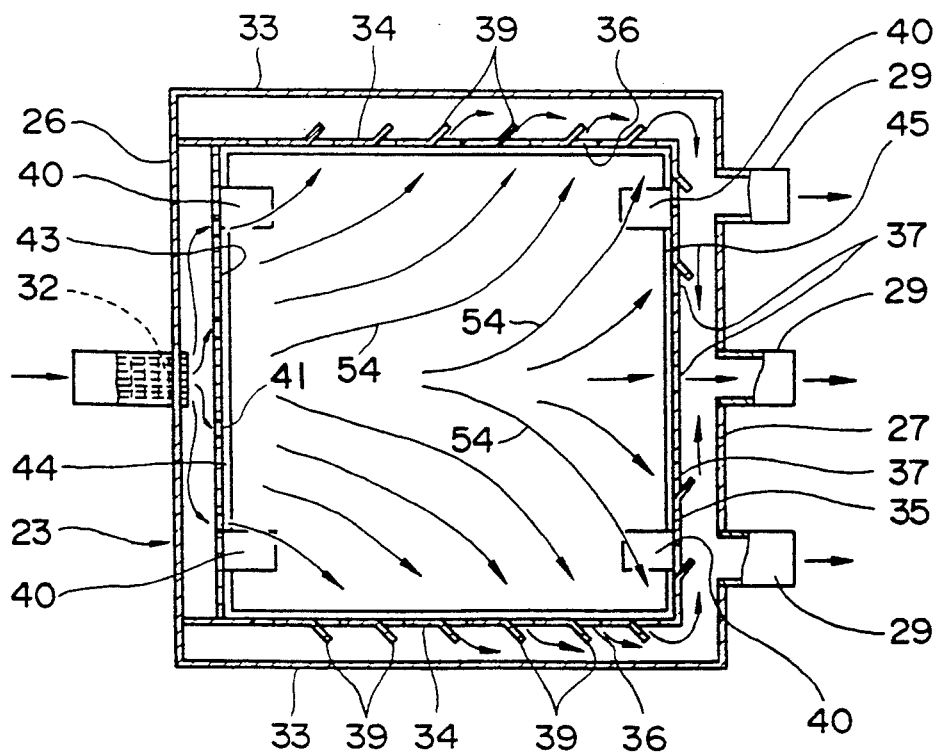

As shown in FIG. 1 to FIG. 3, a plurality of holes 36 are drilled through inner walls 34 of the opposite side parts 33 of the casing 23 and a plurality of holes 37 are drilled through an inner wall 34 of the rear end part 27 of the casing 23. The liquid discharge tubes 29 are connected to the outer wall of the rear end part 27 of the casing 23.

As will be described later, the holes 36 and 37 are dimensioned and located such that a number of bubbles 38 dispersed in the upper flow passage 30 are collected in a hollow portion of the casing 23 by a shortest distance. To assure that the bubbles 38 which have been collected in the hollow portion of the casing 23 do not flow back without fail, a plurality of fins 39 or the like members are disposed at the adequate positions in the vicinity of the respective holes 36 and 37 on the inner walls 34 and 35 of the casing 23.

As is best seen in FIG. 4 and FIG. 5, a pair of protection members 40 each having an U-shaped cross-sectional shape are attached to the fore end part as well as the rear end part of the filter 25. The respective protection members 40 are intended to prevent opposite edge portions 42 of the filter 25 from being damaged or injured. In addition, the protection members 40 serve to form a gap 44 between the edge portion 42 and the inner wall 43 of the casing 23, a gap 45 between the edge portion 42 and the inner wall 35 of the casing 23 and a gap 46 between the edge portion 42 and the upper surface of the lower light permeable plate 21 so as to establish communication between the upper flow passage 30 and the lower flow passage 31 through the gaps 44, 45 and 46 thereby to supply a cooling liquid from the upper flow passage 30 to the lower flow passage 31 therethrough.

A material employable for the light permeable plates 21 and a material employable for the filter 25 are properly selected from a group of photosensitive materials as shown in FIG. 11 in correct consideration of an application field of the apparatus and light absorption characteristics of each photosensitive material. In FIG. 11 curve a represents benzophenone; curve b represents benzoin, curve c represents diaz compound; curve d represents Michler's keton; curve e represents visible polymerized compound; curve f represents photosensitive emulsion for film; curve k represents anhydrous quartz glass; curve l represents quartz glass; curve m represents colored quartz glass; curve n represents quartz soda glass; curve o represents transparent lead glass.

Figure 7:
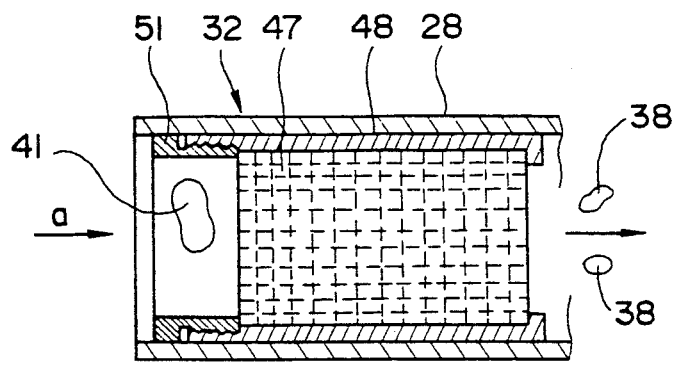
FIG. 7 is a sectional side view of a bubble disintegrating unit for the apparatus.
Figure 8:
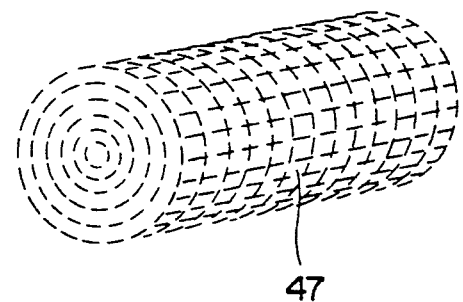
FIG. 8 is a perspective view of a metallic net structure constituting the bubble disintegrating unit in FIG. 7.
Figure 9:
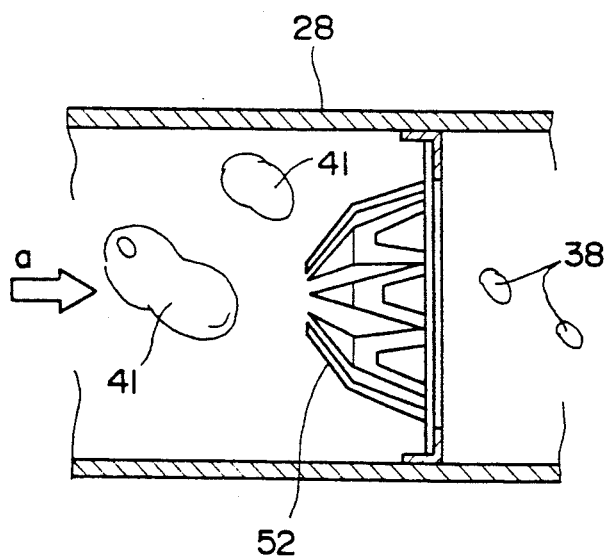
FIG. 9 is a sectional side view of another bubble disintegrating unit for the apparatus.
Figure 10:
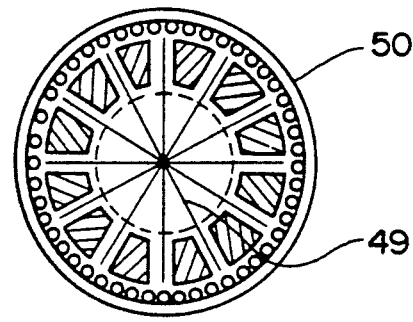
FIG. 10 is a front view of the bubble disintegrating unit in FIG. 9.

The bubble disintegrating unit 32 is intended to disintegrate a block of bubble 41 in pieces before the cooling liquid is introduced into the interior of the apparatus (see FIG. 7). To this end, it is preferable that the bubble disintegrating unit 32 is constructed such that a metallic net 47 having a fine mesh size wound in the cylindrical multi-layered structure as shown in FIG. 8 is received in a holder comprising a cylindrical case 48 and a cap 51 (see FIG. 7). Alternatively, the bubble disintegrating unit 52 is constructed such that a circular disc 50 made of a metallic material or molded of a synthetic resin in the substantially conical configuration while having a plurality of radially extending slits 49 formed thereon (see FIG. 10) is disposed in the liquid supply tube 28 in the opposite direction to the direction of flowing of the cooling liquid i.e., the a arrow-marked direction as seen in FIG. 9. Arrangement of the bubble disintegrating unit 32 or 52 makes it possible to minimize a phenomenon that bubbles in the cooling liquid are largely grown as a temperature of the cooling liquid is elevated. Although the bubble disintegrating unit 32 or 52 is disposed in the liquid supply tube 28 in the shown embodiment, it may be disposed at the intermediate position of a cooling liquid pipe line (not shown).

Next, operation of the apparatus as constructed in the above-described manner will be described below.

Now, it is supposed that the apparatus is arranged in the horizontally laid state and an irradiated light 53 permeates through the apparatus from the above, as shown in FIG. 1. The upper and lower light permeable plates 21 and the filter 25 absorb heat rays and undesirable wavelength components in the irradiated light 53. As a result of the absorptive function as mentioned above, a temperature of the cooling liquid is elevated by heat exchanging between the cooling liquid and the light permeable plates 21 and the filter 25 each having an elevated temperature, whereby a part of the bubbles 41 in the cooling liquid, i.e., bubbles 38 which have passed through the bubble disintegrating unit 32 are floated up in the cooling liquid.

The cooling liquid which has entered the upper flow passage 30 via the liquid supply tube 28 and the distribution passage flows at an increasing speed because the upper flow passage 30 has a cross-sectional area which is gradually reduced toward the rear end of the casing 23. Then, the cooling liquid flows through the holes 36 and 37 while carrying the bubbles 38 away from the lower surface of the upper light permeable plate 21 (refer to flow lines 54 in FIG. 2), as shown in FIG. 5. The bubbles 38 which have passed through the holes 36 and 37 are collected in the hollow portion of the casing 23.

On the other hand, the bubbles 38 which have been grown in size and floated up in the lower flow passage 31 are driven by the cooling liquid which has flowed in the lower flow passage 31 via the gaps 44 and 46 on the lower end side of the filter 25 (refer to flow lines 55 in FIG. 6). Then, the bubbles 38 moves along the lower surface of the filter 25 in the slantwise upward direction, i.e., in the b arrow-marked direction, as shown in FIG. 5. Thereafter, the bubbles 38 are collected in the hollow portion of the casing 23 via the holes 37 on the rear end side of the casing 23 and then discharged to the outside through the liquid discharge tubes 29 together with the bubbles 38 which have entered the lower flow passage 31 from the upper flow passage 30.

Figure 12:
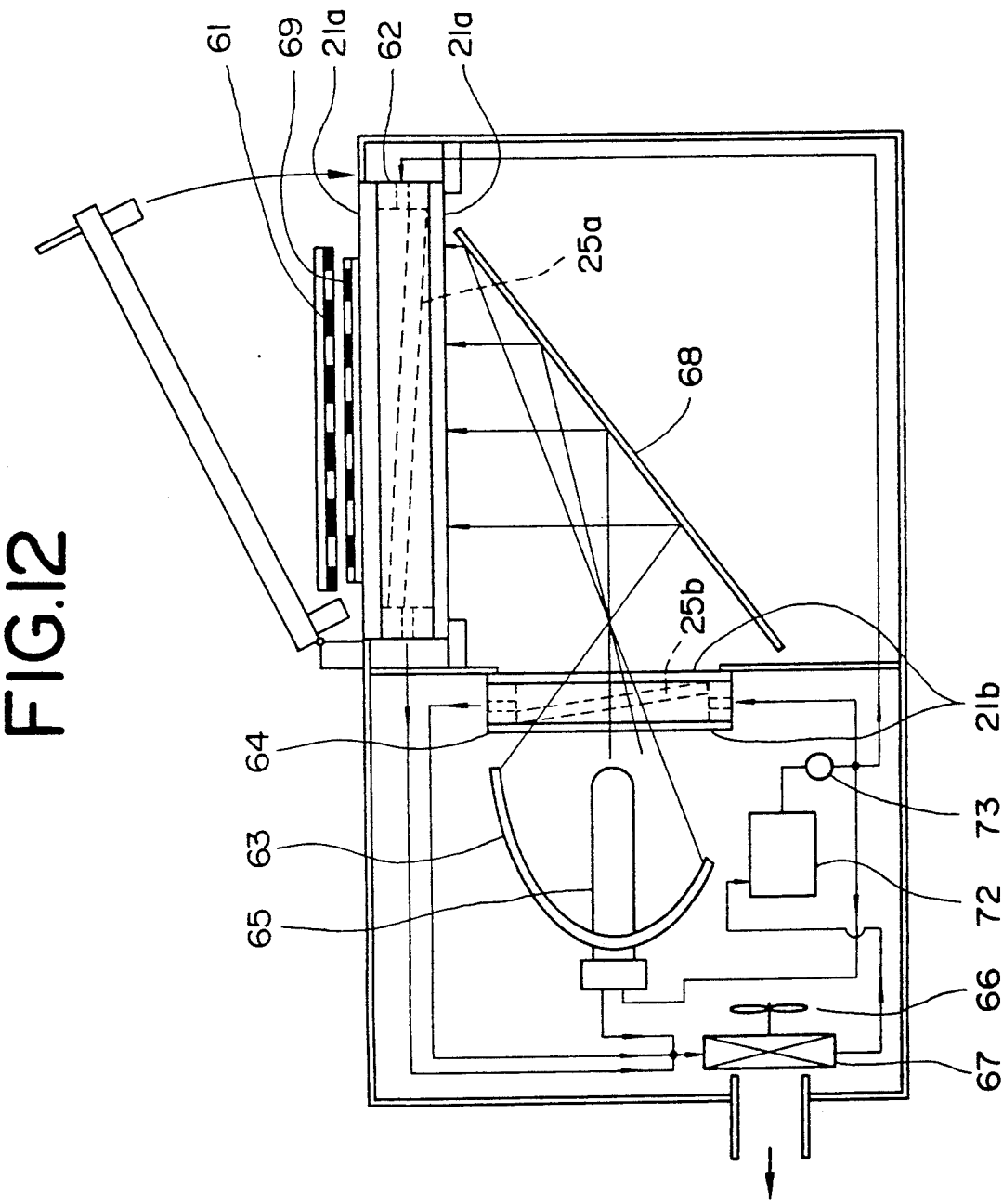
FIG. 12 is a sectional side view of an exposing equipment including light permeating apparatuses in accordance with the first embodiment of the present invention shown in FIG. 1.

An exposing equipment including light permeating apparatuses in accordance with the first embodiment of the present invention is illustrated in FIG. 12. Specifically, the exposing equipment is provided with a first light permeating apparatus 62 below a printed circuit board 61 with a horizontal attitude. In addition, the exposing equipment is provided with a second light permeating apparatus 64 in the vicinity of the aperture of a reflective mirror 63 with a vertical attitude. A cooling liquid for cooling a discharge lamp 65 and the respective light permeating apparatuses 62 and 64 is cooled by an air-cooling type cooling unit comprising a fan 66 and a cooler 67. In FIG. 12, reference numeral 68 designates a plane mirror, reference numeral 69 designates a film, reference numeral 72 designates a storage tank and reference numeral 73 designates a pump.

Since it is essential to suppress thermal expansion of the printed circuit board 61 in order to form a precise pattern on it, it is required that a transparent lead glass (identified by o in FIG. 11) is employed for light permeable plates 21a and 21b and filters 25a and 25b in the respective light permeating apparatuses 62 and 64 so as to remove a visible light and an infrared ray each having a wavelength longer than 400 nm as far as possible. With the exposing equipment constructed in the above-described manner, since heat rays are absorbed at two locations (with an absorption rate of about 70%), i.e., one of them being situated on the outlet side of the reflective mirror 63 and the other one being situated on the incident side of the printed circuit board 61, a precise pattern can be formed on the printed circuit board 61 without thermal expansion of the same.

Figure 13:
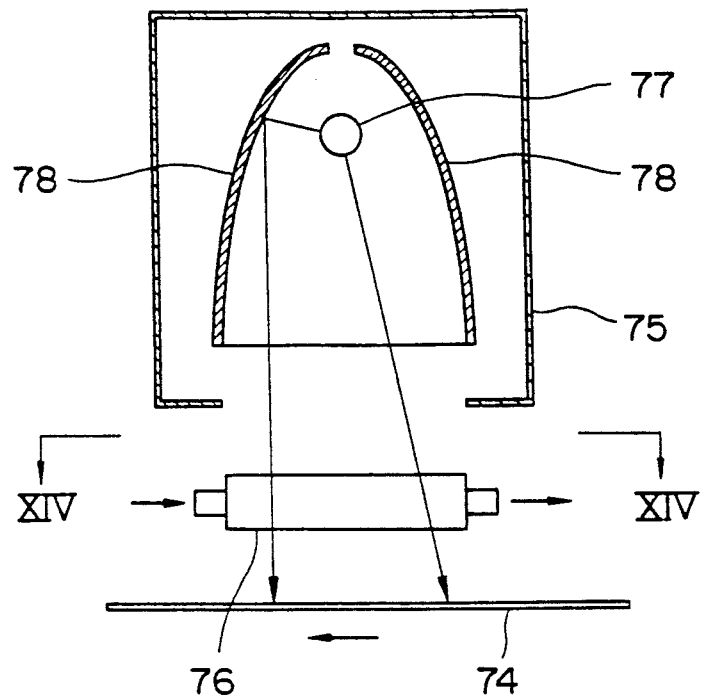
FIG. 13 is a sectional side view of an ultraviolet ray type drying equipment including a light permeating apparatus in accordance with the first embodiment of the present invention.
Figure 14:
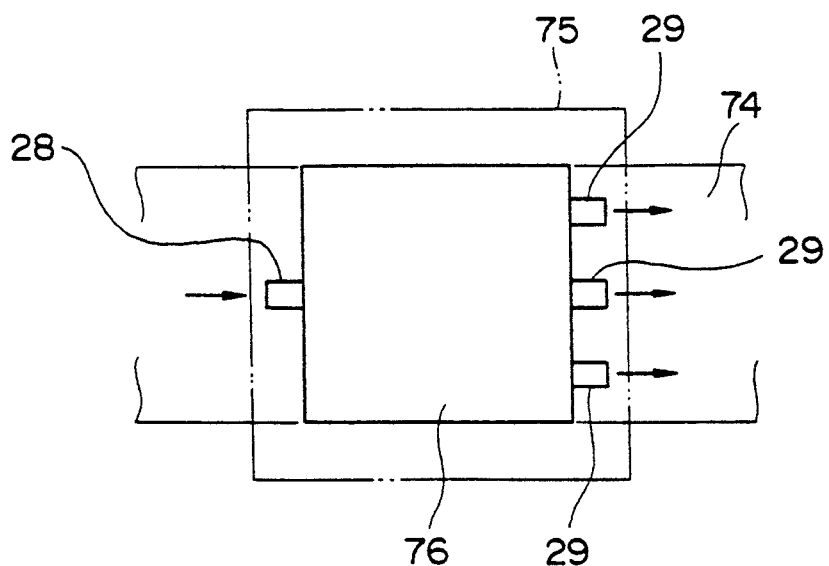
FIG. 14 is a plan view of the drying equipment as seen in the XIV arrow-marked direction in FIG. 13.

An ultraviolet ray type drying equipment (UV drier) including a light permeating apparatus in accordance with the first embodiment of the present invention is illustrated in FIG. 13 and FIG. 14. This drying equipment is intended to dry an ink printed on an original paper for a printing operation. A light permeating apparatus 76 is arranged outside of a lamp house 75. In the drawings, reference numeral 77 designates an air-cooling type discharge lamp and reference numeral 78 designates a reflective mirror.

A conventional drying equipment (not shown) for drying an original paper for a printing operation has a significant problem to be solved for the purpose of preventing an occurrence of burning of the original paper 74 when movement of the original paper 74 is stopped. In view of the foregoing problem, since a transparent lead glass having an excellent property of absorption of heat rays (identified by o in FIG. 11) is employed as a material for light permeable plates and a filter, an occurrence of burning of the original paper 74 for a printing operation can reliably be prevented with the ultraviolet ray type drying equipment as shown in FIG. 13 and FIG. 14.

Figure 15:
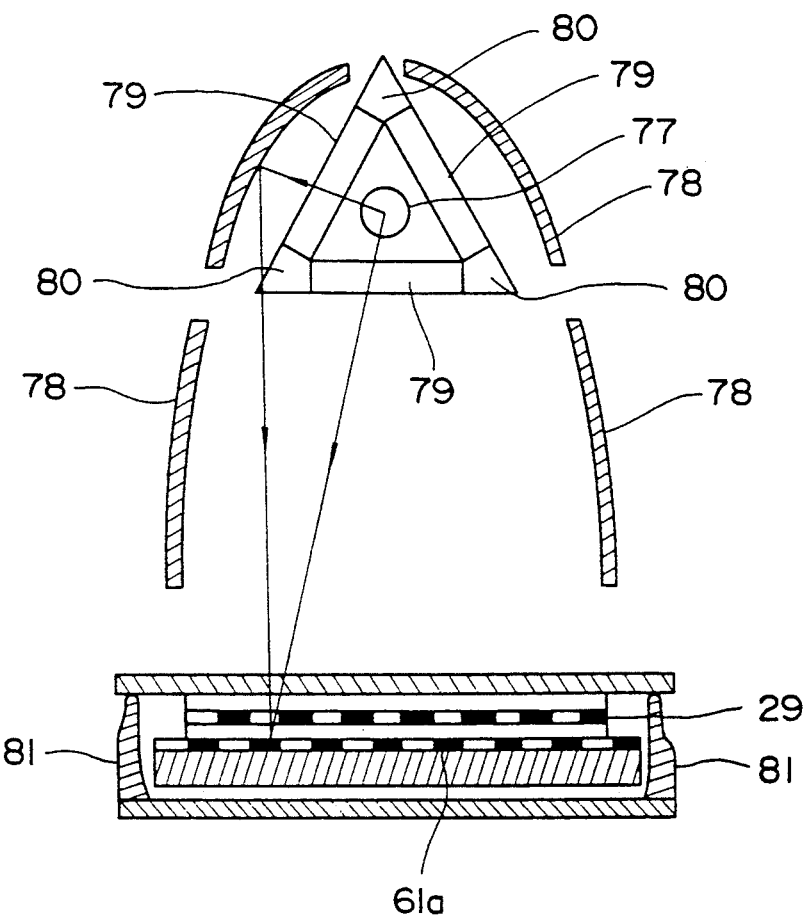
FIG. 15 is a sectional front view of another exposing equipment including a light permeating apparatus in accordance with the first embodiment of the present invention.

Additionally, another exposing equipment including light permeating apparatuses in accordance with the first embodiment of the present invention is illustrated in FIG. 15 The exposing equipment is provided with three light permeating apparatuses 79 which are arranged in the prism-shaped configuration in such a manner as to surround a discharge lamp 77. The construction of the exposing equipment as mentioned above is conveniently employable for forming a clear image on a printed circuit board 61a having large dimensions.

In FIG. 15, reference numeral 80 designates a column-shaped hollow member made of the same material as that for light permeable plates and reference numeral 81 designates a sealing member.

Figure 16:
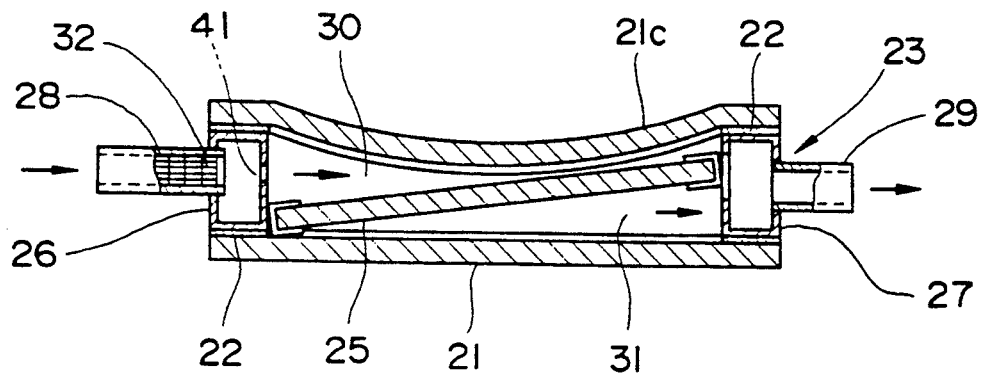
FIG. 16 is a sectional side view of an apparatus for permeating an irradiated light in accordance with a second embodiment of the present invention.
Figure 17:
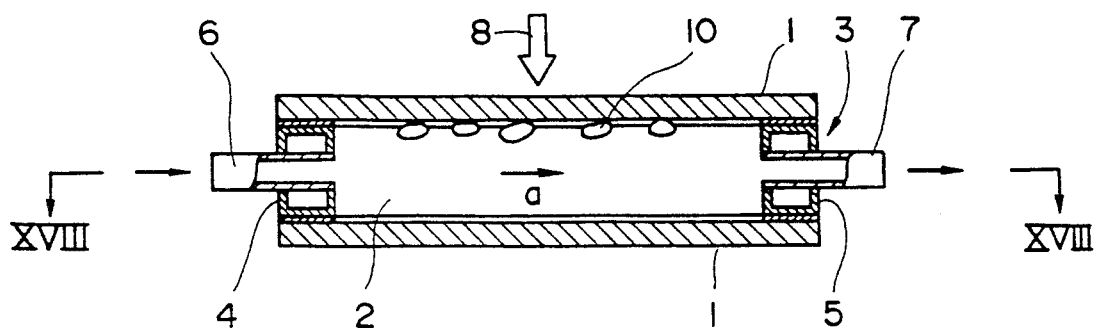
FIG. 17 is a sectional side view of a conventional light permeating apparatus.
Figure 18:
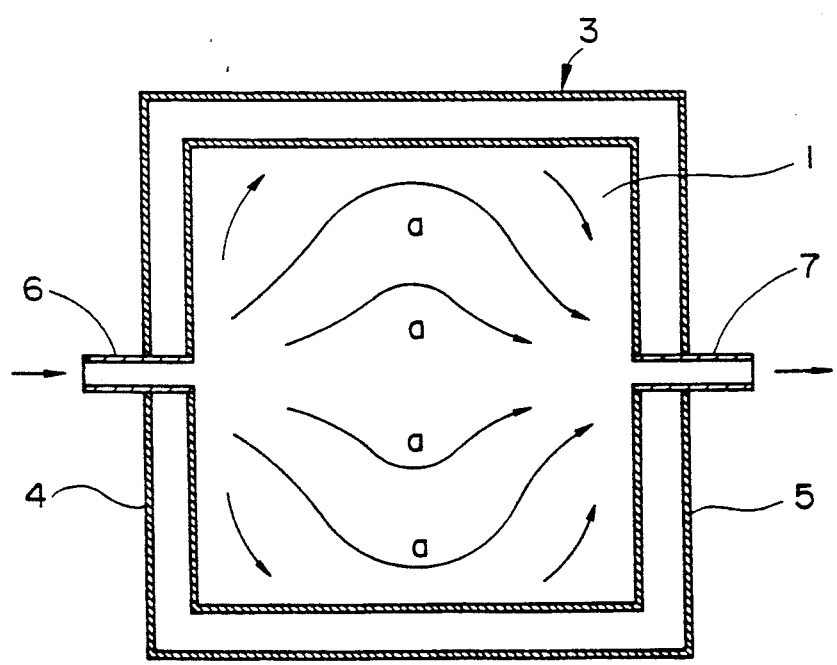
FIG. 18 is a sectional plan view of the apparatus as seen in the XVIII arrow-marked direction in FIG. 17.

An apparatus for permeating an irradiated light in accordance with a second embodiment of the present invention is illustrated in FIG. 16. A characterizing feature of the apparatus in accordance with the second embodiment of the present invention consists in that an upper light permeating plate 21c is concavely curved. The apparatus in accordance with the second embodiment of the present invention is same to the apparatus in accordance with the first embodiment of the present invention with the exception that a cooling liquid flows at a maximized speed in the upper flow passage at the central part of a casing 23 and thereby an effect of removing bubbles at the central part of the casing 23 is enhanced substantially. Although no illustration is seen in FIG. 16, it is desirable that the apparatus of the present invention is arranged on the back side of a reflective mirror. The arrangement of the apparatus in this way makes it possible to effectively absorb heat rays radiated toward the back side of the reflective mirror. This means that the apparatus of the present invention can be utilized as a so-called heat sink.

As will be readily apparent from the above description, the present invention offers the following advantageous effects.

(i) Since the apparatus is constructed such that light permeable plates are assembled with an inclined filter to form an upper wedge-shaped flow passage on the filter so as to allow bubbles in a cooling liquid to be carried away from the flow passage at a high speed and bubbles in the cooling liquid in a lower wedge-shaped flow passage are carried away therefrom while moving along the lower surface of the filter, it becomes possible to prevent turbulent disturb of the permeated light and incorrect operation of the apparatus. As a result, the apparatus of the present invention assures that a clear image can be formed on a photosensitive material and the applicable range of the apparatus can be widened substantially.

(ii) Since a material for the light permeable plates and a material for the filter are properly selected and they are then assembled together, it becomes possible to remove heat rays and undesirable wavelength components in the irradiated light. This makes it possible to prevent thermal expansion of the surface of an object which has received the irradiated light as well as an adverse effect on a photosensitive material in an exposing equipment or the like photographic equipment.

(iii) By virtue of the advantageous effect as mentioned in the preceding paragraph (ii), there is no need of preparing a light source which correctly matches with an optical reactive property of the photosensitive material. Thus, various kind of light sources can be utilized for multi purposes.

While the present invention has been described above with respect to a few preferred embodiments thereof, it should of course be understood that the present invention should not be limited only to them but various changes or modifications may be made without departure from the scope of the invention as defined by the appended claims.

What is claimed is:

1. In an apparatus for permeating an irradiated light wherein said apparatus is arranged at the intermediate position in an optical passage between a light source and an object to be irradiated with a light so that a part of said irradiated light is absorbed by said apparatus and the residual part of the same is irradiated toward a photosensitive material on said object, the improvement wherein said apparatus includes as essential components an opposing pair of light permeable plates arranged in the spaced relationship, a casing fixedly secured to said light permeable plates along the peripheral edge thereof to define a flat space between said light permeable plates, a filter disposed in the inclined state in the forward/rearward direction in said flat space to divide the interior of the flat space into two parts, a liquid supply tube attached to the fore end of the casing so as to allow a cooling liquid to flow through the flat space and liquid discharge tubes attached to the rear end of the casing so as to allow said cooling liquid to be discharged to the outside from the flat space, at least the opposite sides and the rear side of the casing are constructed in the flow passage-shaped configuration, respectively, a plurality of holes are formed on the inner wall of each of the flow passages on the opposite sides and the rear side of the casing, and a material employable for the light permeable plates and a material employable for the filter are properly selected so as to selectively absorb undesirable wavelength components in the irradiated light.

2. The apparatus as claimed in claim 1, wherein a bubble disintegrating unit is disposed at the intermediate position in the liquid supply tube or on the inlet side of the casing.

* * * * *